(12) United States Patent
Madoyski

(10) Patent No.: US 6,482,661 B1
(45) Date of Patent: Nov. 19, 2002

(54) METHOD OF TRACKING WAFERS FROM INGOT

(75) Inventor: Kris Madoyski, Sunnyvale, CA (US)

(73) Assignee: Intergen, Inc., Sunnyvale, CA (US)

(*) Notice: Subject to any disclaimer, the term of this patent is extended or adjusted under 35 U.S.C. 154(b) by 0 days.

(21) Appl. No.: 09/521,926

(22) Filed: Mar. 9, 2000

(51) Int. Cl.⁷ .............................................. H01L 21/00
(52) U.S. Cl. ........................... 438/14; 438/16; 438/800
(58) Field of Search ................................. 438/401, 800, 438/14, 16; 250/492.2; 283/70, 74, 81

(56) References Cited

U.S. PATENT DOCUMENTS

| | | | | |
|---|---|---|---|---|
| 5,537,325 A | * | 7/1996 | Iwakiri et al. | 364/468.28 |
| 5,716,876 A | * | 2/1998 | Muramatsu | 438/14 |
| 5,876,819 A | * | 3/1999 | Kimura et al. | 428/64.1 |
| 5,993,292 A | * | 11/1999 | Oishi et al. | 451/41 |
| 6,004,405 A | * | 12/1999 | Oishi et al. | 148/33.2 |
| 6,109,529 A | * | 8/2000 | Nelson, Jr. | 235/487 |
| 6,112,738 A | * | 9/2000 | Witte et al. | 125/16.02 |
| 6,182,729 B1 | * | 2/2001 | Banzawa et al. | 156/353 |

OTHER PUBLICATIONS

Richards, Ernie, En Rada web site article entitled "If This Gold Ingot would But Speak!", 1988, 1 page.*
Pierret, Robert F., Modular Series on Solid State Deivces—Semiconductor Fundamentals, vol. 1, Addison–Wesley, 1983, pp. 3–14.*

* cited by examiner

Primary Examiner—Michael Sherry
Assistant Examiner—Evan Pert
(74) Attorney, Agent, or Firm—Burns, Doane, Swecker & Mathis LLP

(57) ABSTRACT

A method and system for manufacturing a silicon wafer is disclosed. The ingot's crystallographic orientation is identified. Then ingot indicia is marked onto the ingot. The ingot indicia includes the manufacturer's data as well as the ingot's specific information. The indicia also identifies the crystallographic orientation of the ingot. A plurality of wafers are sliced from the ingot with a portion of the ingot indicia on each of the wafers. Wafer indicia is then marked onto a peripheral edge of the wafer. The wafer indicia includes a mark to identify the crystallographic orientation of the wafer as well as specific information about the ingot and the wafer. The wafer indicia may include dopant levels as well as resistivity and conductivity levels of the wafer.

13 Claims, 4 Drawing Sheets

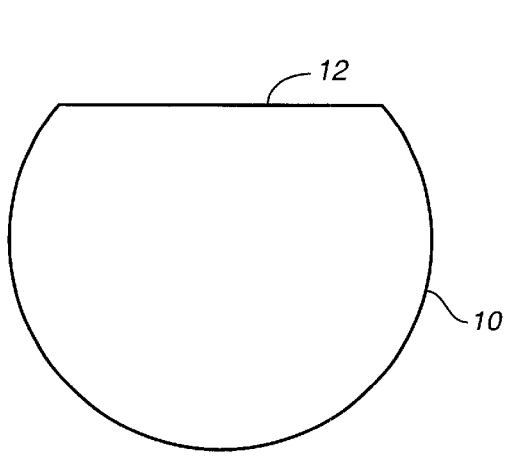
FIG._1 (PRIOR ART)
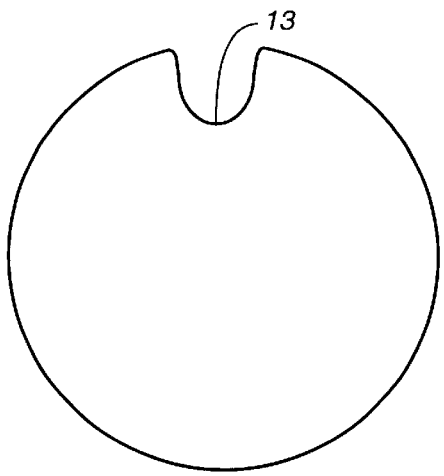
FIG._2 (PRIOR ART)
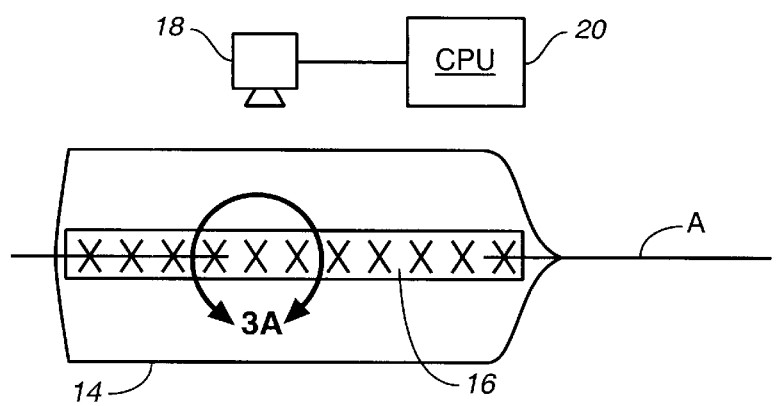
FIG._3
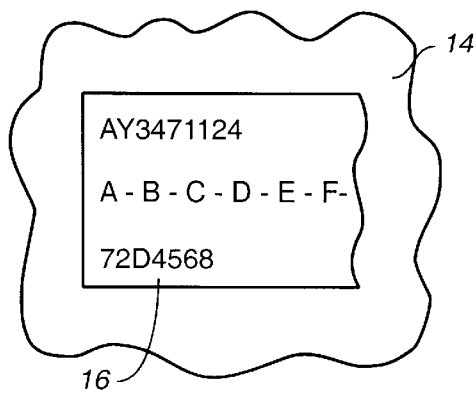
FIG._3A

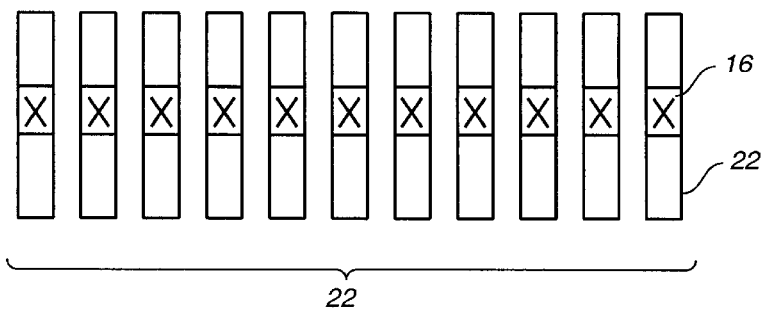
FIG._4
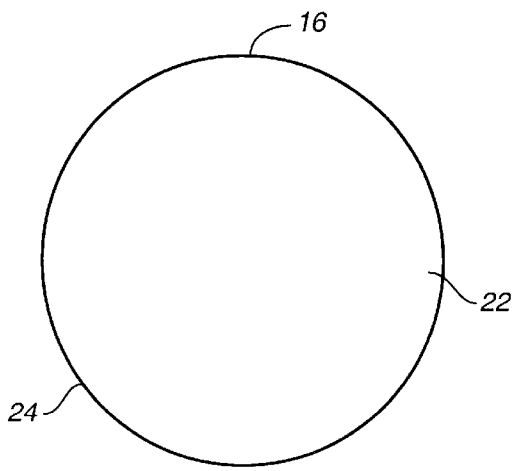
FIG._5
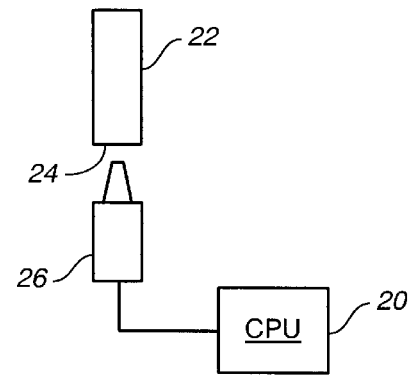
FIG._6
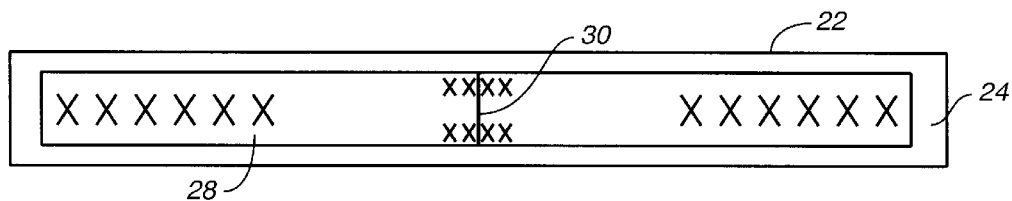
FIG._7

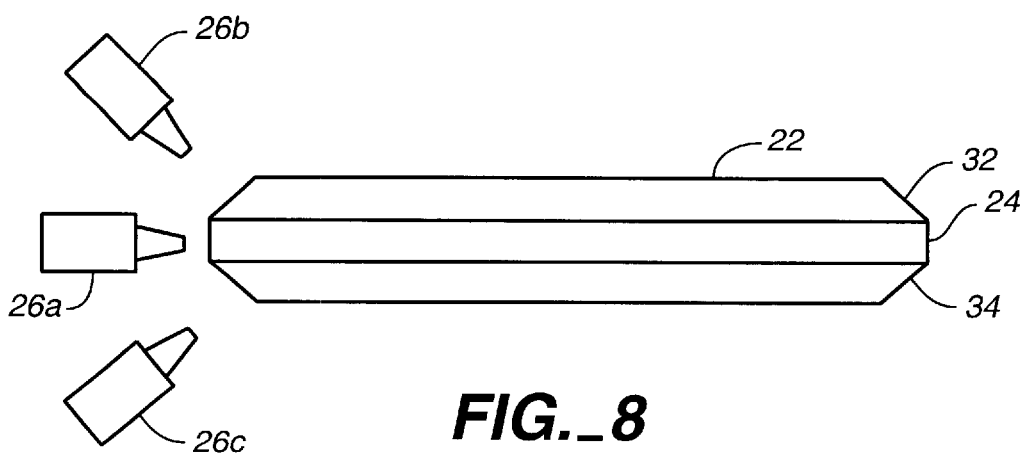
FIG._8
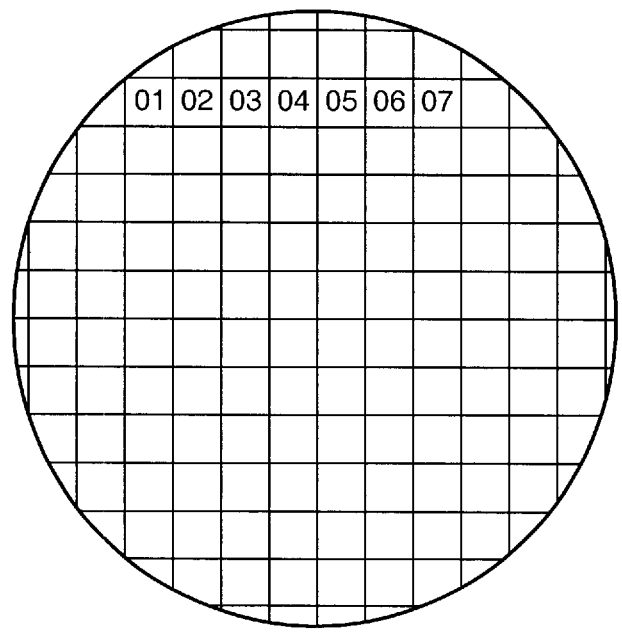
FIG._10
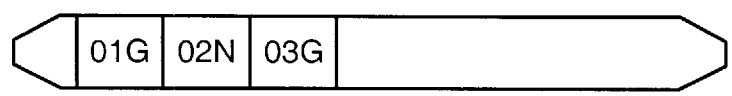
FIG._11

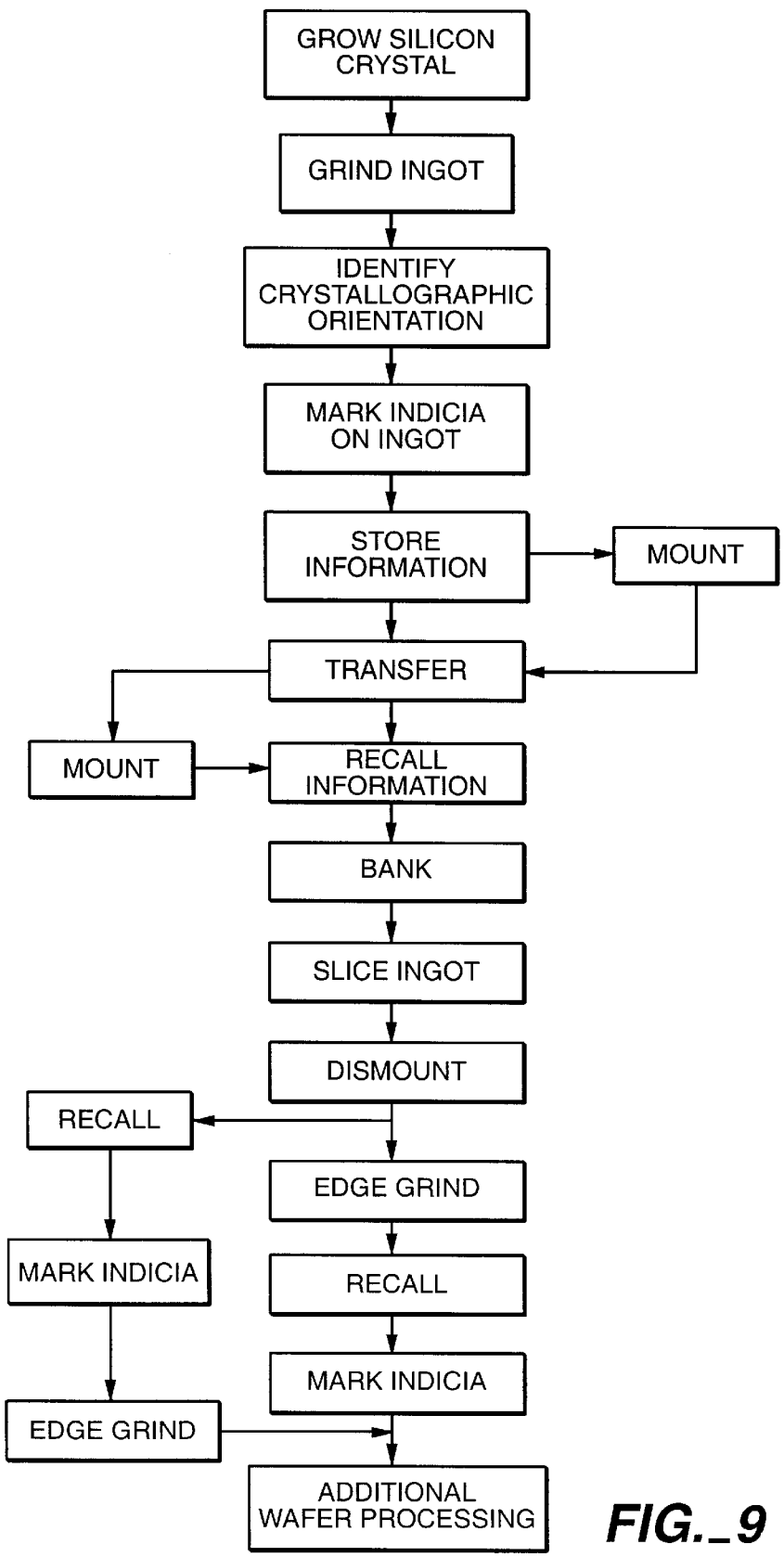
FIG._9

METHOD OF TRACKING WAFERS FROM INGOT

BACKGROUND OF THE INVENTION

1. Field of the Invention

The present invention is directed to the manufacture of silicon wafers, and more particularly, to a method and system for manufacturing silicon wafers from ingots.

2. Brief Description of the Related Art

Referring to FIGS. 1 and 2, current manufacturing processes for silicon wafers 10 include cutting a flat 12 or a notch 13 at the periphery of the wafer to identify the crystalline orientation in the wafer. Practically all of the subsequent manufacturing processes utilize the flat or the notch to orient the wafer properly according to the wafer crystalline orientation.

One of the drawbacks of the current manufacturing process is that the notch removes a portion of the silicon wafer that could otherwise be utilized for the placement of integrated circuits. The notch also creates stress within the wafer making the wafer susceptible to stress cracks near or at the notch. The notch also is a particle generator, which makes it difficult to keep the wafer free from foreign particles during the wafer manufacturing process. A trend in silicon wafer manufacturing is for the manufacturers to make larger diameter silicon wafers. Currently, silicon wafers are manufactured with a 150 mm diameter. In the near future, it is expected that manufacturers will be making 300 mm diameter silicon wafers. As silicon wafer diameters continue to grow in size, the use of a notch will be counterproductive to the use of the larger size wafers. In addition; the stresses and the foreign particles associated with the notch will become more problematic during the manufacturing processes of larger diameter wafers.

Another drawback of the current manufacturing process used is that there is not a means to trace a wafer back to a particular ingot and, more particularly, there is not a means to trace a particular wafer to a particular location within a particular ingot.

Therefore, it would be desirable to have a manufacturing process that would provide traceability of a particular silicon wafer from a location within a particular ingot.

SUMMARY OF THE INVENTION

The present invention discloses a nondestructive method and system for manufacturing an ingot and a silicon wafer. The ingot's crystallographic orientation is identified and then marked by ingot indicia onto the ingot's outer surface. The ingot indicia may include the manufacturer's data as well as the ingot's specific information. The indicia also identifies the crystallographic orientation of the ingot. In the alternative, the indicia could simply be a single line identifying the crystallographic orientation of the ingot. A plurality of wafers are sliced from the ingot with a portion of the ingot indicia on each of the wafers. Wafer indicia is then marked onto a peripheral edge of the wafer. The wafer indicia includes a mark to identify the crystallographic orientation of the wafer as well as specific information about the ingot and the wafer. The wafer indicia may include dopant levels as well as resistivity and conductivity levels of the wafer.

According to one aspect of the method disclosed, a method for manufacturing a silicon wafer is disclosed. The method includes identifying the crystallographic orientation of the ingot and then marking indicia on the ingot and then slicing the ingot into wafers. The indicia on the ingot also may include information relating to the manufacturer of the ingot.

According to another aspect of the invention, a method for manufacturing a silicon wafer is disclosed, which includes marking indicia on a peripheral edge of the wafer. The indicia on the wafer includes a mark to identify the crystallographic orientation of the wafer. The indicia on the wafer also includes information relating to the manufacturer of the wafer.

According to another aspect of the invention, an ingot is disclosed that has a peripheral edge and indicia located on the peripheral edge. The indicia on the ingot includes a mark to identify the crystallographic orientation of the ingot. Further, the indicia on the ingot includes information relating to the manufacturer of the ingot.

According to yet another aspect of the invention, a silicon wafer is disclosed that has a peripheral edge and indicia located on the peripheral edge. The indicia on the wafer includes a mark to identify the crystallographic orientation of the wafer. Further, the indicia on the wafer includes information relating to the manufacturer of the wafer. The indicia on the wafer also includes information relating to the manufacturer of the ingot.

According to another aspect of the silicon wafer disclosed, the wafer has a peripheral edge that has a plurality of surfaces and wafer indicia is located on more than one peripheral edge surface.

In yet another alternative aspect of the silicon wafer disclosed, the wafer has a peripheral edge that has indicia located on the peripheral edge surface. The indicia includes information regarding integrated circuits that are located on the wafer.

BRIEF DESCRIPTION OF THE DRAWINGS

The invention will now be described in greater detail with reference to the preferred embodiments illustrated in the accompanying drawings, in which like elements bear like reference numerals, and wherein:

FIG. 1 is a top plan view of a silicon wafer with a flat according to the prior art;

FIG. 2 is a top plan view of a silicon wafer with a notch according to the prior art;

FIG. 3 is a side elevational view of an silicon crystal ingot with indicia located on the outer surface of the ingot and along a longitudinal axis;

FIG. 3a is a close up view of the indicia on the ingot taken from FIG. 3;

FIG. 4 is a side elevational view of a plurality of silicon wafers that have been sliced from the ingot;

FIG. 5 is top elevational view of a silicon wafer according to the present invention;

FIG. 6 a side elevational view of the silicon wafer with a laser positioned to mark indicia on a peripheral edge of the silicon wafer; FIG. 7 is a side elevational view of the silicon wafer with indicia marked on the peripheral edge;

FIG. 8 is a side elevational view of a silicon wafer with a tapered peripheral edge according to an alternative embodiment of the present invention;

FIG. 9 is a schematic view depicting the method of manufacturing an ingot and a silicon wafer according to the present invention;

FIG. 10 is a schematic top view of the silicon wafer shown with a grid to identify integrated circuit locations on the wafer surface; and FIG. 11 is a side elevational view of the silicon wafer with indicia marked on the peripheral edge that corresponds with the circuits identified by the grid shown in FIG. 10.

DETAILED DESCRIPTION OF THE PREFERRED EMBODIMENTS

A single crystal silicon ingot is formed by known processes. As illustrated in FIGS. 3 and 3a, an ingot 14 is marked with identifying indicia 16. The indicia 16 is located at the outer surface of the ingot along a main axis A. The indicia 16 may include identifying data, such as, the manufacturer of the ingot, the plant that the ingot was manufactured at, the batch number that the ingot was part of, the particular ingot number within the batch, and the composition of the ingot. The indicia 16 also identifies the crystallographic orientation along the length or main axis A of the cylindrical ingot 14. The indicia also includes the orientation of the wafers 22 that are to be sliced from the ingot 14. The indicia 16 is etched onto the ingot by use of a laser using processes known in the art. Prior to the ingot being sliced into wafers, a camera 18 records the indicia 16 from a particular ingot 14 and the information is stored in a CPU 20 with memory.

As shown in FIGS. 4 and 5, the ingot 14 is sliced to produce a plurality of wafers 22. The wafers 22 are then placed on an edge grinder (not shown) to produce a peripheral edge 24. The wafer 22 is positioned on the edge grinder so that the crystallographic orientation identified by the ingot indicia 16 is maintained even if a portion or all of the indicia 16 is removed during the edge grinding process. In the alternative, the edge may be ground first then the crystallographic orientation may be identified and the indicia marked on the peripheral edge of the wafer.

As shown in FIG. 6, a laser 26 is in communication with the CPU 20. The silicon wafer 22 has a peripheral edge 24. The laser 26 etches wafer indicia 28 onto the peripheral edge 24. The wafer indicia 28 is specific to the wafer as well as the ingot that it was sliced from. The wafer indicia 28 also may include specific wafer information, such as dopant, resistivity and conductivity information. In addition, the wafer indicia 28 includes a crystallographic orientation mark 30 for the wafer. The indicia may be located to the left of and the right of the crystallographic mark 30. In addition, several lines of indicia may be utilized, including above and below the crystallographic orientation mark 30.

In an alternative embodiment, the ingot or the wafer has indicia located at two opposite locations on the periphery. The two marks help to align the ingot or the wafer during subsequent manufacturing steps. In addition, the indicia could include a mark that would identify a side of the wafer as well as the crystallographic orientation. For example, a "V" mark could be used to identify which side of the wafer is the dopant side or could be used to mark the top and the bottom sides of the wafer.

As shown in FIG. 8, depending upon the edge grinding process and the resultant shape of the peripheral edge 24 of the wafer 22, the laser may be positioned in any one of three locations. For example, the laser shown in position 26a would mark indicia onto the peripheral side edge 24 of the wafer 22. The laser shown in location 26b would mark indicia onto a peripheral first tapered edge 32, or the laser shown in location 26c would mark indicia onto the peripheral second tapered edge 34. The silicon wafer manufacturer also may utilize all three surfaces of the peripheral edge if desired.

As shown in FIG. 9, a flowchart is provided to summarize the method and system for manufacturing a silicon wafer as described in the present invention. First, a silicon ingot is grown by utilizing known processes and the ingot is ground. The ingot's crystallographic orientation is then identified. Next, the ingot indicia 16 is marked onto the ingot. The ingot indicia 16 includes the manufacturer's data as well as the ingot's specific information The indicia 16 also identifies the crystallographic orientation of the ingot. Next, prior to the ingot being sliced into a plurality of wafers, the indicia is stored in a CPU 20 via a camera 18. The ingot then is either mounted and transferred to the next manufacturer or transferred to the next manufacturer and then mounted. The information about a particular ingot is recalled and the ingot is retrieved from a bank of ingots. Then a plurality of wafers 22 are sliced from the ingot with a portion of the ingot indicia 16 on each of the wafers 22. The wafers are dismounted and are placed on an edge grinder producing a peripheral edge 24 and then the indicia is recalled from memory and marked on the peripheral edge. Preferably, the indicia is marked at a depth that survives the edge grinding process. Nevertheless, if the indicia does not survive the edge grinding process, the ingot indicia 16 is recalled from memory from the CPU 20 and then marked onto the peripheral edge 24 of the wafer 22 via a laser 26 creating wafer indicia 28. The wafer indicia 28 includes a mark to identify the crystallographic orientation 30 of the wafer as well as specific information about the ingot and the wafer. The wafer indicia 28 may include dopant levels as well as resistivity and conductivity levels of the wafer. Next, additional processing may be performed on the silicon wafer prior to the manufacture of integrated circuit onto the surface of the silicon wafer.

Referring to FIG. 10, a schematic top view of the silicon wafer is shown with a grid to identify integrated circuit locations on the wafer surface. The grid identifies a location by X and Y coordinates, as known in the art. If an integrated circuit does not pass quality standards or needs to be identified for other reasons, the particular circuit location may be identified by the grid. The advantage of the present method and system is that a particular grid location and information regarding the circuit at that location may also be identified on the peripheral edge of the wafer. Referring to FIG. 11, indicia marked on the peripheral edge of the wafer is shown. The indicia corresponds with a circuit located at a particular location on the wafer, as identified by the grid. The indicia may record whether a particular circuit passes quality inspections required by a manufacturer or may record other features of the circuit.

The marking of the ingot and the silicon wafer as described in the present invention allows for a system of marking indicia on the peripheral edge of the ingot and the silicon wafer, wherein the indicia may be utilized throughout the manufacturing process of the integrated circuits. The marking of indicia on the peripheral edge of the wafer provides a distinct advantage for the manufacturers of integrated circuits because they will be able to determine characteristics that are specific to each silicon wafer throughout the manufacturing process. The ability to track a particular manufacturer's silicon wafers as well as the ability to track batches of wafers back to specific ingots is beneficial. For example, when a manufacturer has a recall on a batch of ingots or a batch of silicon wafers, the integrated circuit manufacturer will be able to quickly determine which if any of his wafer inventory is affected by the recall. In addition, integrated circuit chip manufacturers have not had the ability in the past to trace a silicon wafer back to a specific ingot or more particularly to a specific location in an ingot. Therefore, the system and method of manufacturing silicon wafers as disclosed in the present invention provide distinct advantages over current manufacturing processes. Another advantage is the marking of indicia on the peripheral edge that corresponds with integrated circuits located on the wafer surface. The indicia includes the location of the of the circuit on the wafer and may include whether a particular circuit meets certain criteria.

While the invention has been described in detail with reference to the preferred embodiments thereof, it will be apparent to one skilled in the art that various changes and modifications can be made and equivalents employed, without departing from the present invention.

What is claimed is:

1. A method for manufacturing a silicon wafer, comprising:

identifying a crystallographic orientation of an ingot;

marking alphanumeric indicia on the ingot to identify the crystallographic orientation of the ingot; and slicing a plurality of wafers from the ingot with a portion of the alphanumeric indicia on each of the wafers.

2. The method of claim 1, further comprising the step of storing the indicia in a CPU via a camera before slicing the ingot into a plurality of wafers.

3. The method of claim 2, further comprising the steps of recalling the alphanumeric indicia from the CPU, and marking the wafer with the indicia to include a mark to identify the crystallographic orientation of the wafer and specific information about the ingot and the wafer.

4. The method of claim 1, further comprising the steps of placing the wafer on an edge grinder to produce a peripheral edge; and marking the wafer on the peripheral edge with an additional indicia to include a mark to identify the crystallographic orientation of the wafer and specific information about the ingot and the wafer.

5. The method of claim 1, wherein the alphanumeric indicia includes information regarding the circuits on the wafer.

6. The method of claim 1, wherein the alphanumeric indicia on the wafer includes information relating to a manufacturer of the ingot.

7. The method of claim 1, wherein the alphanumeric indicia on the wafer includes information relating to a manufacturer of the wafer.

8. The method of claim 1, wherein the alphanumeric indicia on the wafer is on a peripheral edge of the wafer.

9. The method of claim 1, wherein the alphanumeric indicia on the ingot includes information relating to the ingot.

10. The method of claim 1, further comprising a step of placing the wafer on an edge grinder to produce a peripheral side edge, a peripheral first tapered edge and a peripheral tapered second edge.

11. The method of claim 10, wherein the step of marking comprises marking the indicia on the peripheral side edge.

12. The method of claim 10, wherein the step of marking comprises marking the indicia on at least one of the peripheral tapered edges.

13. The method of claim 2, further comprising a step of recalling the indicia from the CPU, and wherein the step of marking comprises marking the wafer with the indicia on a peripheral side edge of the wafer.

* * * * *

UNITED STATES PATENT AND TRADEMARK OFFICE
CERTIFICATE OF CORRECTION

PATENT NO.    : 6,482,661 B1
DATED         : November 19, 2002
INVENTOR(S)   : Kris Madeyski It is certified that error appears in the above-identified patent and that said Letters Patent is hereby corrected as shown below:

<u>Title page,</u>
The spelling of the Inventor's name is incorrect. Please correct the spelling to read as follows: -- Kris Madeyski --

Signed and Sealed this

First Day of April, 2003

JAMES E. ROGAN
*Director of the United States Patent and Trademark Office*